United States Patent [19]
Estes, Jr.

[11] Patent Number: 5,148,358
[45] Date of Patent: Sep. 15, 1992

[54] RECTIFIER COMMUTATION CURRENT SPIKE SUPPRESSOR

[75] Inventor: Earl M. Estes, Jr., Tucson, Ariz.

[73] Assignee: Hughes Aircraft Company, Los Angeles, Calif.

[21] Appl. No.: 679,965

[22] Filed: Apr. 3, 1991

[51] Int. Cl.$^5$ .................. H02M 7/06; H02M 3/155
[52] U.S. Cl. .................... 363/24; 323/351; 363/48; 363/53; 363/126
[58] Field of Search .............. 363/24, 25, 53, 126, 363/48; 361/111; 323/351, 282

[56] References Cited

U.S. PATENT DOCUMENTS

| | | | |
|---|---|---|---|
| 4,323,840 | 4/1982 | Gawler | 323/287 |
| 4,607,319 | 8/1986 | Assow et al. | 363/48 |
| 4,839,786 | 6/1989 | Ohosuga | 363/52 |
| 4,977,493 | 12/1990 | Smith | 363/126 |

FOREIGN PATENT DOCUMENTS

| | | | |
|---|---|---|---|
| 66276 | 5/1980 | Japan | 323/351 |
| 294255 | 11/1988 | Japan | |
| 441632 | 12/1974 | U.S.S.R. | 323/351 |
| 773596 | 10/1980 | U.S.S.R. | 323/351 |

OTHER PUBLICATIONS

Stuart, "Reducing Switching Stress in High Power, High Voltage DC-DC Converter," Powercon Proceedings, B1-1 to 7, San Fran. USA, 4-6 May 1978.

Calkin et al, "Circuit Techniques for Improving the Switching Loci of Transistor Switches in Switching Regulators," IEEE Trans. on Industry Appl., vol. 1A-12, No. 4, pp. 364-369, Jul./Aug. 1976.

*Primary Examiner*—William H. Beha, Jr.
*Attorney, Agent, or Firm*—C. D. Brown; R. M. Heald; W. K. Denson-Low

[57] ABSTRACT

A circuit for reducing the commutation transient in a switch-driven (12) free-wheeling rectifier (20) applied to a load (10) via a continuously conducting energy conducting inductor (28), in which a further inductor (34) and diodes (32, 38) are interconnected with the switch-driven rectifier (20) to free-wheel recovered commutation energy from rectifier (20) when the switch is non-conducting. In other circuit variations temporary energy storage is aided by one or more capacitors (72) and additional diodes (52, 54, 80, 107, 122) during turn-on of rectifier (20), which energy recycled back into the circuit to minimize power dissipation and reduce circuit component heating.

7 Claims, 2 Drawing Sheets

RECTIFIER COMMUTATION CURRENT SPIKE SUPPRESSOR

BACKGROUND OF THE INVENTION

1. Field of the Invention

The present invention pertains to the conduction of electric current by a P-N junction rectifier, and, more particularly, to a circuit for commutating such rectifiers to the non-conducting state while simultaneously preventing the creation of relatively high current transients or "spikes".

2. Description of Related Art

In rectifiers employing P-N junction devices, in the conduction of electric current charge is temporarily stored in the rectifying junction that has to be removed when commutating the rectifier to its non-conducting state. At the time of conduction, the rectifier is essentially a short-circuit which can in many switch mode uses produce a relatively high current "spike" which undesirably increases circuit losses, electromagnetic interference as well as heating of circuit components. Prior art apparatus for reducing such current transients have relied upon storing the energy in an inductor and subsequently dumping it into a resistor for spike dissipation which disadvantageously results in substantial energy being lost and the dissipated energy results in undesirable heating of the resistor, the diode and surrounding components which can reduce reliability and require additional heat sinking. Also, the resistor value if either too large or too small will not dissipate the energy in the shortest possible time and there are tradeoffs in the selection of the resistor value which it is desirable to avoid since they can be reflected in other circuit requirements.

SUMMARY OF THE INVENTION

Briefly, it is a fundamental aim and object of the present invention to reduce the current rise rate and peak current magnitude of the commutation current of a junction rectifier by placing an inductor in series with the current path. Also, the energy that is stored in the inductor each time the current is switched on is subsequently recycled through other parts of the circuit of this invention into the host power circuit minimizing power dissipation and component heating. In a first embodiment of the invention, the energy stored in the inductor during turn-off is permitted to free wheel through a further rectifier and further inductor effecting smooth commutation of all of the rectifiers minimizing power losses and electromagnetic energy generation. In further circuit variations of the invention, temporary storage is aided via one or more capacitors and by interconnection via additional rectifiers the energy stored in an inductor during turn-on of the fundamental rectifying switch is recycled back into the circuit for the desired power dissipation minimization and reduction of component heating.

DESCRIPTION OF PREFERRED EMBODIMENT

Figure 1:
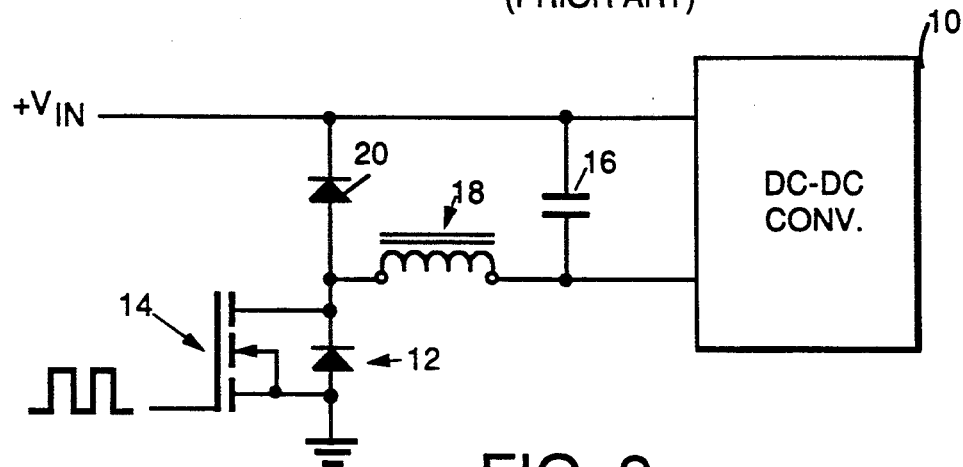
FIG. 1 of the drawing depicts a circuit schematic of a P-N junction rectifier exhibiting commutation current spikes during use.

FIG. 1 depicts a circuit schematic of what is termed a buck converter which has application in supplying a pre-regulated input to a DC-DC converter 10, the details of the latter being omitted as being beyond the requirements for understanding the present invention. A field effect transistor 12 (e.g., MOSFET) is alternately switched on and off by a variable duty cycle rectangular wave applied to the MOSFET gate 14. Output voltage of the transistor is applied across the capacitor 16 which functions as an input to the DC-DC converter and will always be less than the input voltage V. Current continuously flows in a direction of right to left in the FIG. 1 circuit through the inductor 18 so that the converter is said to operate in a continuous inductor conduction mode.

When the FET 12 is conducting, current increases through the inductor 18 so that energy is stored in the inductance. When the FET 12 is turned off, current flows along the path of the inductor 18, rectifier 20 and capacitor 16 with the inductor serving as the source of energy. During this nonconduction portion of the cycle, the current flow is decreasing but does not decrease to zero before the FET turns on again to start the next cycle. A feedback mechanism may be provided (not shown) to sense the output voltage and regulate the duty cycle of the rectangular gate drive to the FET 12 in order to complete closed loop regulation.

Current flow through the rectifier 20 results in the storage of some charge in the PN junction of the rectifier junction 20. At turnon of the FET 12 current through the rectifier 20 reverses until the stored charge in the rectifier junction has been removed. During the charge removal, the rectifier is essentially a short circuit, and also at this time the FET can be considered a short circuit resulting in a line to ground short. The cumulative effect of this condition is to produce a transient "spike" of rectifier commutation current that can cause undesirable electromagnetic interference (EMI), circuit heating and/or component destruction.

Figure 2:
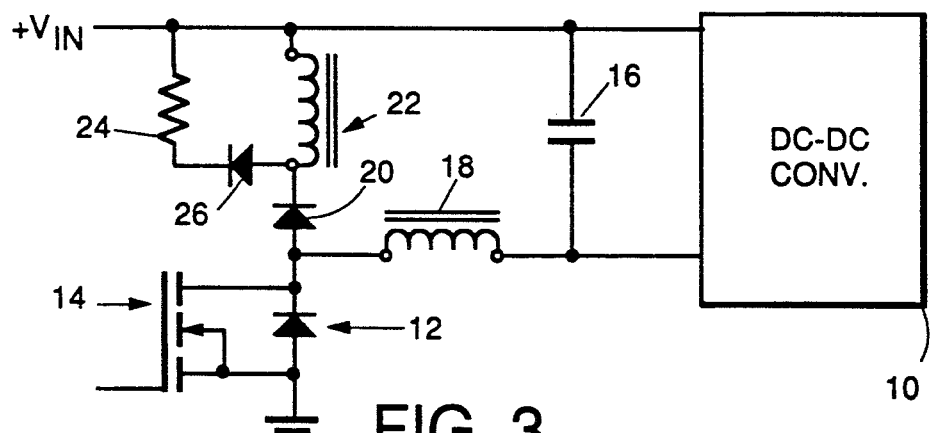
FIG. 2 depicts a prior art circuit for commutation current spike suppression.

In order to eliminate or suppress current transients which normally occur in the semiconductor rectification circuit of FIG. 1, which is a quite commonly encountered circuit at the present time, the typical known approach is that shown in FIG. 2 where the difference from the circuit of FIG. 1 consists in the introduction of a further series inductor 22 between the rectifier 20 and input voltage line and a series circuit consisting of a resistor 24 and rectifier 26 between the common point of rectifier 20, inductor 22 and the input voltage line. Inductor 22 limits the rate of rise of the rectifier commutation current during the period when the stored charge is being removed from rectifier 20 which effectively eliminates the transient converting it to a controlled ramp. This results, however, in energy being stored in the inductor 22 at the time that the diode 20 completes its turnoff and this stored energy must be removed quickly to prepare for the next storage cycle. The removal is accomplished by the energy stored in inductor 22 being dumped into the resistor 24 via diode 26. Stored energy removal such as this takes time resulting in limiting the minimum duty cycle wasting energy that might have been conserved and, of course, generates heat in the circuit surroundings.

Figure 3:
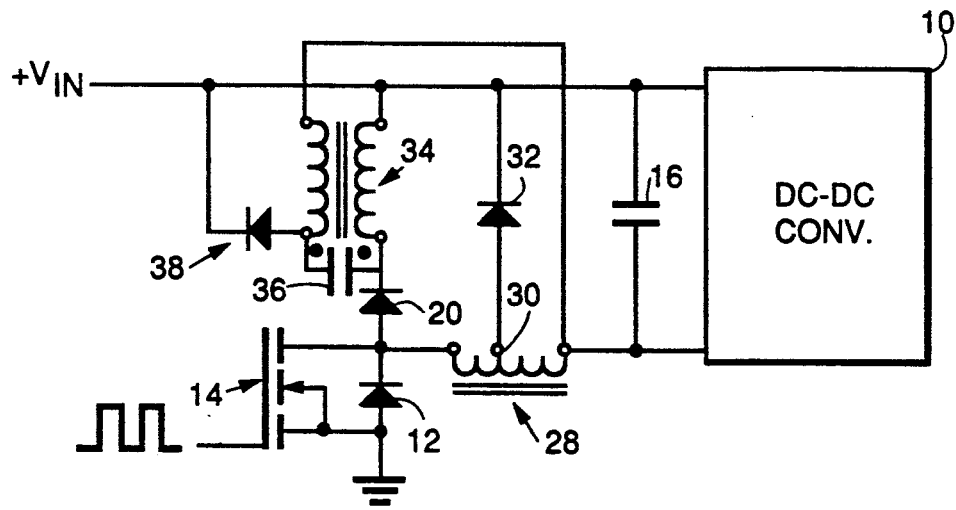
FIG. 3 is a rectifier commutation current spike eliminator of the present invention.

With reference now to FIG. 3, a first embodiment of circuit apparatus of the present invention is depicted which effects reduction of the current transient developed in the buck pre-regulator shown in FIG. 1. The common circuit elements of the buck pre-regulator are enumerated the same as in FIG. 1. The inductor 28 differs from the inductor 18 of FIG. 1 in that a tap 30 is provided to which a diode 32 is interconnected with the DC plus line. A bifilar wound coupled inductor 34, which is the counterpart of inductor 22 of FIG. 2, has one side serially connected between the DC plus line and the diode 20 and its other side serially connected via a second capacitor 36 between the common point of the inductor 28 and capacitor 16 with the common point of the diode 20 and the one side of the inductor 34. A third diode 38 (the counterpart of diode 26 in FIG. 2) is forwardly connected between the common point of the inductor and capacitor 36 to the DC plus line.

At the time of turnoff of the diode 20, energy is stored in the inductor 34 in the same manner as described in the FIG. 1 pre-regulator, and the stored energy is dumped into the capacitor 16 via diode 38 as opposed to being dissipated in a resistor as in the prior art technique shown in FIG. 2. The speed at which the energy in inductor 34 can be dumped is substantially increased since there is no L/R time constant associated with the energy transfer cycle. When the MOSFET turns off, the current in inductor 28 momentarily free wheels through the diode 32 then smoothly transfers to diode 20 as the current in the inductor 34 rises to equal the current in the inductor 28. The result of the latter action is that inductor 34 provides a smooth commutation of all three diodes 20, 32 and 38 minimizing power losses and EMI generation.

Figure 4:
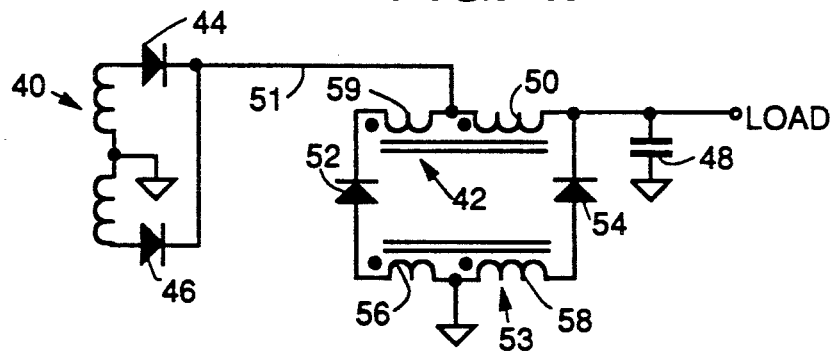
FIGS. 4, 5, and 6 depict alternate embodiments of circuits of the present invention for accomplishing spike elimination.

With respect to the version depicted in FIG. 4, a winding 40 is actually the center-tapped secondary of an output transformer, used in a buck-regulated, push-pull, DC-DC converter. Inductor 42 is a tapped inductor, which is the counterpart of a non-tapped, energy-storage inductor conventionally employed in this type of buck converter, and is operated in the continuous inductor conduction mode, i.e. its stored energy is not depleted to zero during any portion of the DC-DC converter's operating cycle. In a push-pull buck converter, the voltage across transformer winding 40 is nominally zero during the portions of the cycle when both driving switches (e.g. FET), not shown, are off. In a conventional circuit, diodes 44 and 46 conduct throughout these off periods. Since the energy storage inductor is the energy source during the off periods, these dual current paths can be assumed to originate in the inductor, and to flow through the capacitor 48 to ground, both halves of winding 40, diodes 44 and 46, and return to the energy-storage inductor. The currents flowing through diodes 44 and 46, which are effectively in parallel due to transformer action, cause charge to be stored in the junctions of these rectifiers. When either of the driving switches (not shown) turns on, a short circuit current flows via the path through these diodes and consequently is reflected back to the input circuits via the output transformer (i.e., winding 40 and associated primary, not shown).

Assuming a polarity that causes the anode of diode 44 to be positive, this short-circuit current path is through diode 44 in the direction of forward conduction, and 46 in the direction of reverse conduction, both halves of transformer winding 40 and return to diode 44. This short circuit current path continues to flow until the charge stored in the P-N junction of diode 46 has been "swept out", at which time this diode recovers abruptly to its non-conducting state.

Assuming the use of the fastest recovery rectifiers available, this short circuit current flows for a few tens of nanoseconds. If the parasitic inductance in the driving circuit is very low, as is desirable because of other considerations, the reverse recovery short circuit current may rise to a few tens of amperes. The result is power loss, heating of various circuit components, and generation of electromagnetic interference. The circuit of FIG. 4 eliminates this short-circuit in the manner described which immediately follows.

When either of the push-pull driving switches turns off, the voltage across transformer winding 40 drops to zero, causing current to flow through diodes 44 and 46 in the same manner as with the conventional circuit. This current path is from winding 50 of inductor 42, capacitor 48, ground through both halves of transformer winding 40, and diodes 44 and 46 which, due to transformer action, are effectively in parallel and return to winding 50 via common current line 51. Since the anodes of diodes 44 and 46 are at ground potential, it is evident that the voltage on their cathodes, and consequently the voltage at the tap on energy storage inductor 42 is at a negative potential. Also, the anode of diode 52 is at a negative potential. Tapped inductor 53 is designed with a ratio that causes the voltage on the anode of diode 54 to be less than that required to conduct. With voltage across winding 56 of inductor 53, current rises smoothly in this winding. This current flows from ground, through rectifier 52, both windings of inductor 42, capacitor 48 and returns to ground via capacitor 48. As this current increases it causes the current through rectifiers 44 and 46 to decrease smoothly to zero, and thus their stored charge to be removed in a non-violent manner. When the recovery of rectifiers 44 and 46 is complete, i.e., they no longer conduct in reverse, the voltage on their cathodes, and thus the voltage on the tap of inductor 42 is allowed to rise to a state of equilibrium. Current flows from ground through winding 56 of inductor 53, rectifier 52, windings 59 and 50, and returns to ground via capacitor 48 and the load (not shown). This state continues until one of the driving switches turns on, with energy stored in inductors 42 and 53 being delivered to the output.

When one of the driving switches (not shown) turns on, the resulting voltage across winding 40 of the output transformer causes diode 44 or 46 to conduct with the result that the voltage on the tap of inductor 42 will rise to a prescribed voltage. During its recovery period, diode 52 is a temporary short so that the voltage across winding 56 of inductor 53 is approximately the same as the potential at the cathode of diode 52. The resulting voltage across winding 58 causes reverse bias of diode 54. The voltage across winding 40 causes the current in this winding and in diode 52 to decay to zero and then increases smoothly in the opposite sense until diode 52 recovers, i.e. its stored charge has been swept out, at which time it becomes an open circuit.

When the recovery of diode 52 is complete, the current flowing into the dotted end of winding 56 is replaced by a current less than that flowing from winding 58 through diode 54 into the load. Thus, the energy required to sweep the stored charge from rectifier 52 is recycled into the output, and not wasted. Conservation of this energy is a feature of the invention.

Figure 5:
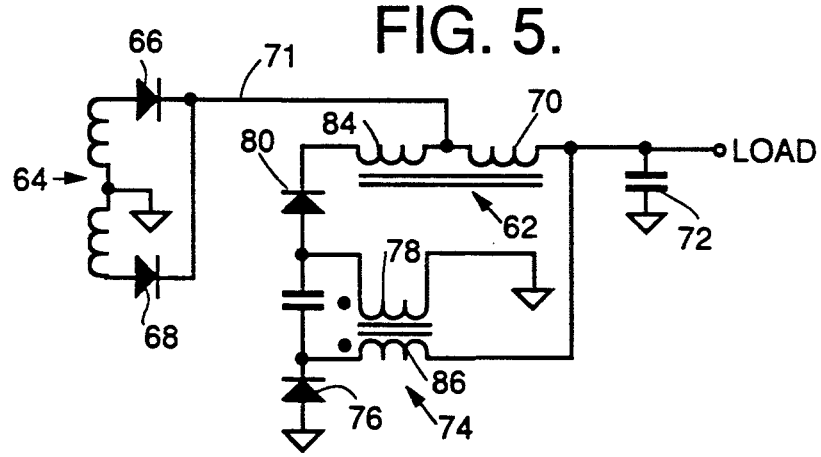

The FIG. 5 version is similar to the FIG. 4 embodiment and offers certain additional advantages in controlling the effects of leakage inductance. When either of the push-pull driving switches (not shown) turns off, the voltage across transformer winding 64 drops to zero, causing current to flow through rectifiers 66 and 68 in the same manner as with the conventional circuit described earlier. This current path is from winding 70 of energy storage inductor 62, capacitor 72 to ground, both halves of transformer winding 64, diodes 66 and 68 which, due to transformer action, are effectively in parallel, and finally return to winding 70 of tapped inductor 62 via a common current path 71. Since the anodes of diodes 66 and 68 are at ground potential, it is evident that the voltage on their cathodes and consequently the voltage at the tap on energy storage inductor 62 is at a negative potential. Since the inductor 62 and the tapped inductor 74 each have a 1:1 turns ratio, the voltage on the cathode of diode 76 is a negative potential that is just sufficient to cause diode 76 to conduct. Current rises smoothly in winding 78 starting from zero and at an acceptable value per microsecond. This current flows from ground, through diode 80, both windings of inductor 62, capacitor 72, and returns to ground. As this current increases it causes the current through diodes 66 and 68 to decrease smoothly to zero, and thus their stored charge to be removed in a non-violent manner. When the recovery of rectifiers 66 and 68 is complete, i.e., they no longer conduct the voltage on their cathodes and thus the voltage on the tap of inductor 62 is allowed to rise to a state of equilibrium. Current now flows from ground, through winding 78 of inductor 74, diode 80, windings 84 and 70 of inductor 62, and returns to ground via capacitor 72 and the load (not shown). This state continues until one of the driving switches turns on, with energy stored in inductors 62 and 74 then being delivered to the output.

When one of the driving switches turns on, the resulting voltage across winding 64 of the output transformer causes diode 66 or 68 to conduct, with the result that the voltage on the tap of inductor 62 rises to a voltage sufficient to cause the current in winding 78 and in diode 80 to decay at an acceptable rate. This current decays to zero, and then increases smoothly in the opposite sense until diode 80 recovers, (i.e. its stored charge has been swept out) at which time it becomes an open circuit. When the recovery of diode 80 is complete, the current flowing into the dotted end of winding 78 is replaced by an equal current flowing from winding 86 through the output load, to ground and then diode 76. Thus, the energy required to sweep the stored charge from rectifier 80 is recycled into the output and is not wasted.

Figure 6:
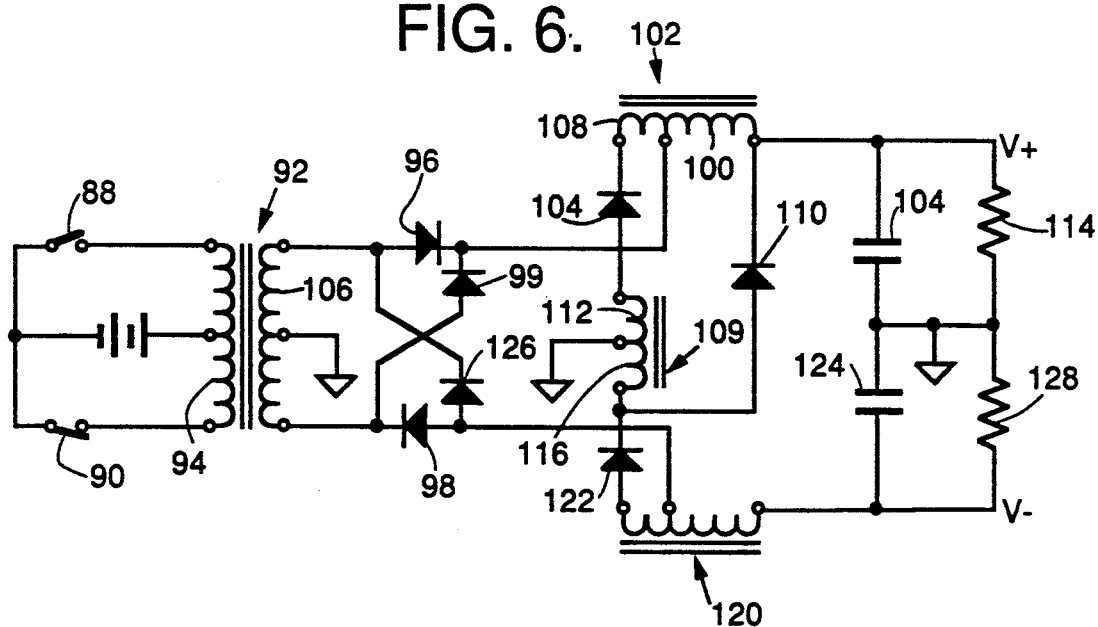

A still further embodiment is that shown in FIG. 6 which is analogous to the FIG. 4 version, except that additional circuit apparatus has been added to produce a negative output that is the complement of the positive output. A further advantage of this embodiment is improved control of leakage inductance. A pair of mechanical push-pull driving switches 88 and 90 are shown for illustrative purposes controlling input voltage to transformer 92, however, in an actual practical construction of the invention the switch function would be provided by power MOSFETs or bipolar transistors.

When either of the driving switches 88, 90 turns off, the voltage across transformer input winding 94 drops to zero, causing current to flow through rectifiers 96 and 98 in the same manner as in the FIG. 4 circuit. This current path is from winding 100 of energy storage inductor 102, capacitor 104, ground, both halves of transformer winding 106, diodes 96 and 98 (which due to transformer action are effectively in parallel) and return to winding 108 of tapped inductor 102. Since the anodes of rectifiers 96 and 98 are at ground potential, it is evident that the voltage on their cathodes, and consequently the voltage at the tap on energy storage inductor 102 is at a negative potential. Assuming for simplicity that the tap voltage is minus 1.0 volt, we see that the voltage across winding 100 is approximately 14 volts plus 1.0 volt, i.e. 15 Volts. Assuming a turn ratio for inductor 102 of 1 to 3, the voltage on the cathode of diode 107 is calculated to be minus 6 Volts. If we assume a 1.0 volt drop across diode 107, the voltage on the anode of diode 107 is seen to be minus 5 Volts. Since tapped inductor 109 is designed with a ratio of 1 to 1, the voltage on the cathode of diode 110 is seen to be 5 volts.

It has been found that current rises smoothly in the inductor 109 starting from zero at a rate of 5 volts divided by the inductance of winding 112, and flows from ground, through diode 107, both windings of inductor 102, capacitor 104, and returns to ground. As this current increases it causes the current through rectifiers 96 and 99 to decrease smoothly to zero, and thus their stored charge to be removed in a non-violent manner.

When the recovery of diodes 96 and 98 is complete, i.e. their reverse current flow ceases, the voltage on their cathodes, and thus the voltage on the tap of inductor 102 rises to a state of equilibrium. Current at this time flows from ground, through winding 112 of inductor 109, diode 107, both windings of inductor 102 and returns to ground via load resistor 114. This state continues until one of the driving switches turns on.

When one of the driving switches 88 or 90 turns on, the resulting voltage across winding 106 of the output transformer 92 will cause diodes 96 or 98 to conduct, with the result that the voltage on the tap of inductor 102 will rise to a voltage that produces a bias on the cathode of diode 110 resulting in reverse bias on diode 110. The current in winding 112 and in diode 107 decays to zero, and then increases smoothly in the opposite sense until diode 107 recovers, i.e. its stored charge has been swept out, at which time it becomes an open circuit.

When the recovery of diode 107 is complete, the current flowing into winding 112 is replaced by an equal current flowing from winding 116 through diode 110 into the output. Thus, the energy required to sweep the stored charge from diode 107 is recycled into the output, and not wasted.

The described operation of the FIG. 6 circuit is only approximate in that it does not discuss the circuit operation for the complementary currents produced by the V– end of the power supply. For this purpose, the following circuit elements are provided: inductor 120 and diode 122 complementary to inductor 102 and diode 107; capacitor 124 a complement of capacitor 104; and diode 126 corresponding in function to diode 98. Also, if load resistors 114 and 128 are equal, there are not currents to ground, as in any balanced system. On the other hand, if load resistors 114 and 128 are unequal, then only difference currents flow to ground.

The foregoing description and drawing merely explain and illustrate the invention, and the invention is not limited thereto, except insofar as those skilled in the art who have the disclosure before them are able to make modifications and variations therein without departing from the scope of the invention.

What is claimed is:

1. A circuit for reducing the commutation transient in a switch-driven rectifier applied to a load via a continuously conducting energy storage inductor, comprising:
   a further inductor and rectifier means interconnected with the switch-driven rectifier to cyclically capture rectifier commutation energy and restore it to the circuit;
   said storage inductor is serially connected in a current path between the switch and a first load terminal; the further inductor has first and second windings, the first winding serially connected through the switch-driven rectifier between the switch and storage inductor connection and a second load terminal; a capacitor shunting the further inductor first and second windings; a diode connecting the common point of the capacitor and further inductor second winding with a second load terminal; a second diode interconnecting a tap on the first inductor with the second load terminal; and the further inductor first winding having one end connected to the second load terminal and one end of the second winding interconnected with the load first terminal.

2. A circuit as in claim 1, in which the switch is a MOSFET.

3. A circuit as in claim 2, in which the driving switch is connected to the further rectifier via a transformer.

4. A circuit as in claim 1, in which the load has first and second terminals, with a capacitor connected across these terminals to supplement the filtering action of the continuously conducting inductor.

5. A circuit eliminating commutation transients in current from a buck regulated push-pull DC-DC converter, the output of which includes a grounded center-tapped output transformer winding, the ends of which windings are polarized to a common current line by first and second diodes, comprising:
   a first tapped inductor having its tap connected to the common current line and one end connected to the load;
   a capacitor interconnecting the first tapped inductor one end and ground; and
   a second tapped inductor having its tap connected to ground, one end of said second inductor connected to the first inductor one end through a third diode, and the other end of said second inductor being connected with the first inductor other end via a fourth diode.

6. A circuit eliminating commutation transients in current from a buck regulated push-pull DC-DC converter, the output of which includes a grounded center-tapped output transformer winding the ends of which windings are polarized to a common current line by first and second diodes, comprising:
   a first inductor having two end terminals and a tap terminal, said tap terminal being connected to the common current line;
   a first capacitor interconnecting one end terminal of the first inductor and ground;
   a second inductor having first and second windings on a common core, each winding having two opposite end terminals;
   a second capacitor interconnecting one end terminal of the second inductor first winding with one terminal of the second winding;
   a third diode interconnecting the second inductor second winding one end and ground; and
   a fourth diode interconnecting the first inductor other end and the second inductor first winding other end.

7. A circuit reducing commutation current transients from the output of a cyclically switched transformer, the transformer output having a grounded center tap, comprising:
   diode means interconnected between the transformer and first and second current lines for passing current therealong in a polarized manner;
   first and second inductors each having opposite end and tap terminals, said tap terminals being individually connected to different diodes of the first and second current lines;
   a third tapped inductor having its opposite ends connected respectively via first and second diodes to an end of the first and second inductors, and the tap of said third inductor being grounded;
   the first and second current lines being connected respectively to the first and second inductor taps;
   a third diode interconnecting the first inductor other end terminal to the common of the third inductor and first diode; and
   capacitor means interconnecting the first and second inductor other end terminals and ground;
   said first and second inductor other end terminals serving as the circuit output.

* * * * *